(12) United States Patent
Regnier et al.

(10) Patent No.: US 9,006,851 B2
(45) Date of Patent: Apr. 14, 2015

(54) PHOTOVOLTAIC DEVICE WITH THROUGH-VIAS

(75) Inventors: Christophe Regnier, Bernin (FR); Olivier Hinsinger, Barraux (FR); Daniel Gloria, Detrier (FR); Pascal Urard, Theys (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 150 days.

(21) Appl. No.: 13/198,458

(22) Filed: Aug. 4, 2011

(65) Prior Publication Data
US 2012/0032291 A1    Feb. 9, 2012

(30) Foreign Application Priority Data
Aug. 5, 2010    (FR) ..................... 10 56456

(51) Int. Cl.
*H01L 31/0203*   (2014.01)
*H01L 25/16*    (2006.01)
*H01L 31/0224*   (2006.01)
(Continued)

(52) U.S. Cl.
CPC ........... *H01L 25/16* (2013.01); *H01L 21/76838* (2013.01); *H01L 23/481* (2013.01); *H01L 25/0652* (2013.01); *H01L 31/02245* (2013.01); *H01L 2223/6677* (2013.01); *H01L 2225/06513* (2013.01); *H01L 2225/06541* (2013.01); *Y02E 10/50* (2013.01); *H01L 2224/16145* (2013.01); *H01L 2224/94* (2013.01); *H01L 2224/97* (2013.01); *H01L 2924/15192* (2013.01)

(58) Field of Classification Search
CPC ............. H01L 2225/06541; H01L 21/768381; H01L 23/481; H01L 25/0652
USPC .......................................... 257/E27.125, 433
See application file for complete search history.

(56) References Cited

U.S. PATENT DOCUMENTS 4,838,952 A * 6/1989 Dill et al. ................. 136/256
6,559,479 B1 5/2003 Lüdemann
(Continued)

FOREIGN PATENT DOCUMENTS

DE    198 54 269 A1    6/2000
DE    199 54 259 A1    5/2001
(Continued)

OTHER PUBLICATIONS

République Française Institut National De La PropriétéIndustrielle, Rapport De Recherche Préliminaire (Preliminary Search Report); issued in French Patent Application No. 1056456 on Apr. 6, 2011 (2 pages).

*Primary Examiner* — Kimberly Rizkallah
*Assistant Examiner* — Alexander Belousov
(74) *Attorney, Agent, or Firm* — Slater & Matsil, L.L.P.

(57) ABSTRACT

A stand-alone device comprising a silicon wafer having its front surface including a first layer of a first conductivity type and a second layer of a second conductivity type forming a photovoltaic cell; first vias crossing the wafer from the rear surface of the first layer and second vias crossing the wafer from the rear surface of the second layer; metallization levels on the rear surface of the wafer, the external level of these metallization levels defining contact pads; an antenna formed in one of the metallization levels; and one or several chips assembled on said pads; the metallization levels being shaped to provide selected interconnects between the different elements of the device.

30 Claims, 2 Drawing Sheets

(51) Int. Cl.
*H01L 21/768* (2006.01)
*H01L 23/48* (2006.01)
*H01L 25/065* (2006.01)

(56) References Cited

U.S. PATENT DOCUMENTS

| | | | |
|---|---|---|---|
| 7,390,700 B2* | 6/2008 | Gerber et al. | 438/108 |
| 7,619,901 B2* | 11/2009 | Eichelberger et al. | 361/763 |
| 2005/0206576 A1* | 9/2005 | Gloria et al. | 343/800 |
| 2005/0268962 A1* | 12/2005 | Gaudiana et al. | 136/255 |
| 2006/0060238 A1* | 3/2006 | Hacke et al. | 136/256 |
| 2007/0024551 A1* | 2/2007 | Gelbman | 345/85 |
| 2009/0050190 A1* | 2/2009 | Nishida et al. | 136/244 |
| 2010/0012172 A1* | 1/2010 | Meakin et al. | 136/251 |
| 2010/0148293 A1* | 6/2010 | Jain et al. | 257/434 |

FOREIGN PATENT DOCUMENTS

| | | |
|---|---|---|
| EP | 2 028 696 A2 | 2/2009 |
| JP | 10-242443 A | 9/1998 |

\* cited by examiner

PHOTOVOLTAIC DEVICE WITH THROUGH-VIAS

This application claims the benefit of French Patent Application No. 10/56456, filed on Aug. 5, 2010, entitled "Photovoltaic Cell and Stand-Alone Sensor" which application is hereby incorporated herein by reference to the maximum extent allowable by law.

TECHNICAL FIELD

The present invention relates to stand-alone devices associating various electronic components, a photovoltaic cell, and an antenna.

BACKGROUND

In various applications, stand-alone electronic devices, that is, devices assembling various electronic functions and rechargeable power supply means, are desired to be formed. As an example, sensors powered by a rechargeable cell by photovoltaic effect are desired to be formed, such sensors being capable of transmitting, on demand or periodically, the data that they contain.

Generally, such stand-alone devices are manufactured by assembly of separate components. JP-A-10242443 discloses a stand-alone device wherein a solar cell surrounds IC chips, whereby the surface area of the whole assembly is larger than the surface area of the solar cell.

SUMMARY OF THE INVENTION

An object of the present invention is to provide an assembly of components forming a stand-alone device which is particularly compact.

Another object of the present invention is to provide such a stand-alone device formed by using techniques tried and tested in the field of semiconductor manufacturing and assembly.

Thus, an embodiment of the present invention provides a stand-alone device comprising a silicon wafer having its front surface comprising a first layer of a first conductivity type and a second layer of a second conductivity type forming a photovoltaic layer; first vias crossing the wafer from the rear surface of the first layer and second vias crossing the wafer from the rear surface of the second layer; metallization levels on the rear surface of the wafer, the external level of these metallization levels defining contact pads; an antenna formed in one of the metallization levels; and one or several chips assembled on said pads; the metallization levels being shaped to provide selected interconnects between the different elements of the device.

According to an embodiment of the present invention, the area located vertically above the antenna comprises no vias.

According to an embodiment of the present invention, the chips are a battery, a sensor, and a radio frequency generator.

According to an embodiment of the present invention, the rear surface of the wafer and the chips are embedded in a resin.

The foregoing and other objects, features, and advantages of the present invention will be discussed in detail in the following non-limiting description of specific embodiments in connection with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

As usual in the representation of integrated circuits, the various cross-section views of components are not drawn to scale.

DETAILED DESCRIPTION OF ILLUSTRATIVE EMBODIMENTS

A stand-alone wireless device comprising the association of a sensor and of a transmitter (and possibly of a receiver), both wireless, is considered herein. The transmitter comprises an antenna transmitting radio frequency signals. This device comprises a stand-alone power supply comprising a battery connected to a photovoltaic cell.

This stand-alone device is formed from a single silicon wafer. A photovoltaic cell is formed on a first surface of the wafer. Interconnection levels and contact pads capable of receiving components corresponding to the various components of the stand-alone device (sensor, transmitter, possible receiver, battery . . . ) are formed on a second surface of the wafer. The antenna may be formed from a metallization level belonging to the interconnection levels.

Figure 1:
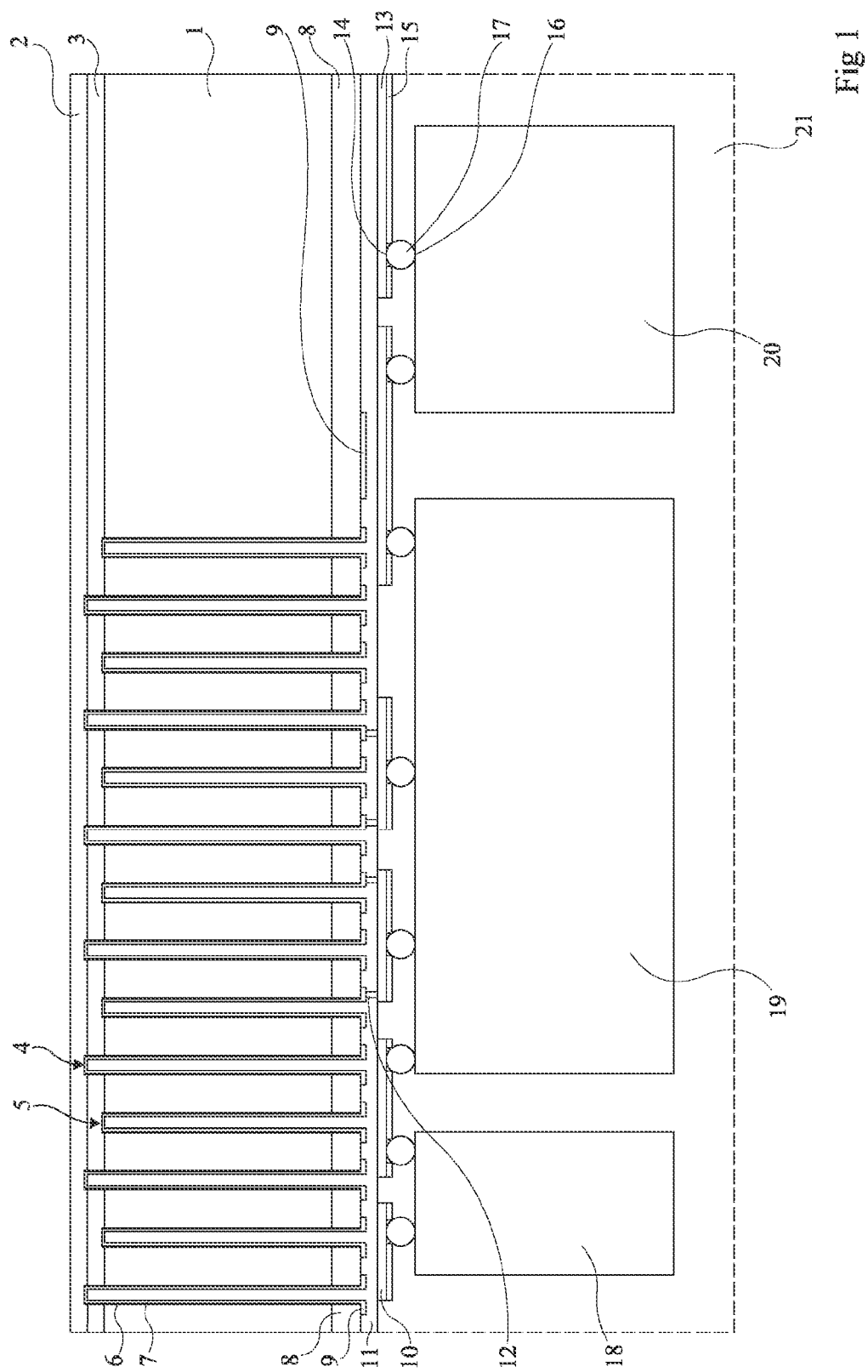
FIG. 1 is a simplified cross-section view illustrating a stand-alone wireless sensor according to a specific embodiment.

FIG. 1 is a cross-section view of an embodiment of such a stand-alone sensor. The upper portion of FIG. 1 shows a specific photovoltaic cell structure. The upper surface of a silicon wafer 1 comprises a P-type layer 2 and an N-type layer 3 forming the PN junction of the photovoltaic cell. Vias 4 extend from the lower surface of layer 2 and cross the entire wafer 1 down to its lower surface. Similarly, vias 5 extend from the lower surface of layer 3 and cross the entire wafer 1. The vertical walls of vias 4 and 5 are covered with an insulating layer 6, then filled or sheathed over their entire internal surface, including the bottom, with a metal layer 7.

Making contacts with layer 2 and 3 by means of vias starting from the lower surface of wafer 1 avoids the need for a conductive comb for making contact on the upper surface of layer 2. Such a comb is either made of a transparent conductor, which is expensive and poses technological problems, or of a metal such as aluminum, which shadows part of the upper surface of the cell and decreases its efficiency.

The rear surface of wafer 1 is coated with an insulating layer 8 and support interconnection levels comprising a first internal metallization level 9 and a second external metallization level 10. The first and second metallization levels are spaced apart by an insulating layer 11, through which vertical holes 12 filled with metal establish the desired connections between the first and second metallization levels. Although only two metallization levels are described herein, it should be understood that the number of metallization levels will be selected according to the interconnects to be formed between the device elements. Vias 4 and 5 emerge on metallization level 9. Metal layer 7 of the vias is electrically connected to portions of metallization level 9.

In an area of the device, above which there is no via 4 or 5, an antenna 13 is formed in a metallization level, here metallization level 10. Metallization level 10 also comprises contact pads 14, delimited by openings in an insulating layer 15 covering metallization 10. Pads 14 are capable of receiving components in the form of chips provided by terminals 16. Each of terminals 16 of the chips is connected to one of pads 14 via contact balls 17. From left to right, these components are a sensor 18, a battery 19, and a radio frequency generator 20 which transforms the electric signals transmitted by the sensor into radio frequency signals intended for antenna 13. Chips 18, 19, and 20 are altogether embedded in a protection resin 21.

The interconnection level metallizations are especially configured so that:

all first vias 4 are connected to a first terminal of battery 19;
all second vias 5 are connected to a second terminal of battery 19;
battery 19 is connected to sensor 18 and to radio frequency generator 20; and
sensor 18 is connected to radio frequency generator 20.

Figure 2:
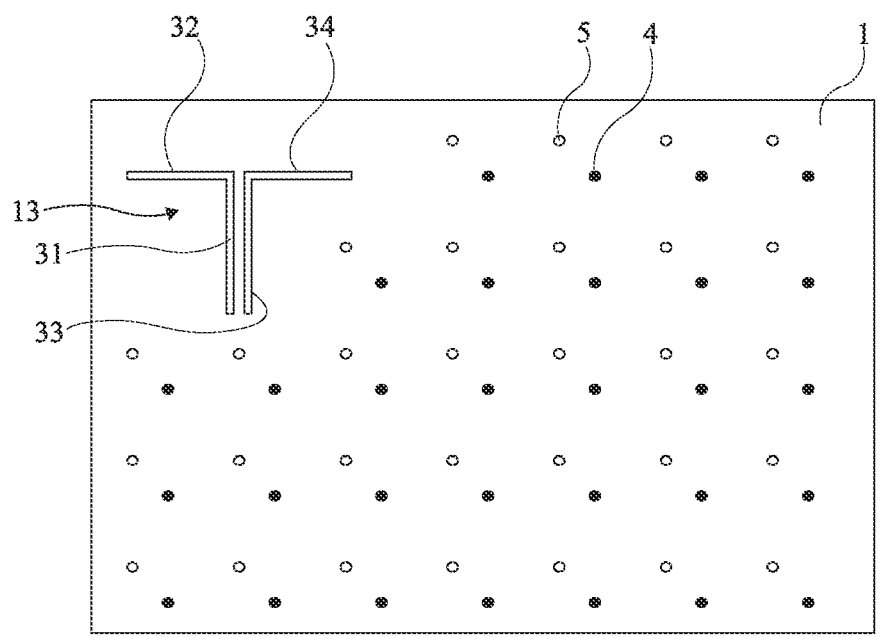
FIG. 2 is a simplified top view illustrating an example of the bottom surface of a portion of a silicon wafer used in the stand-alone sensor of FIG. 1.

FIG. 2 is a simplified top view illustrating an example of the lower surface of a portion of silicon wafer 1 of the stand-alone device. In FIG. 2, only the projections of vias 4 and 5 and of antenna 13 are shown. The antenna 13 is located at the device periphery, in an area without vias 4 or 5.

In this example, the antenna is of umbrella type. It is formed of two metal lines, each one being L-shaped, juxtaposed back to back. Each metal line comprises a first branch, respectively, 31, 33, and a second branch, respectively 32, 34, perpendicular to the first branch. Branches 31, 33 are parallel to each other. The second branches are opposite to each other. The length of the first branches enables impedance matching with the interconnection levels. The length of the second branches determines the spectral transmission band.

As an example, silicon wafer 1 may have a surface area ranging from 1 to 4 cm$^2$ (with a side ranging from 1 to 2 cm). The wafer dimensions will be selected, on the one hand, so that the photovoltaic cell provides a sufficient power and, on the other hand, to be able to receive the chips adapted to the desired device. Layer 2 of P conductivity type may have a thickness ranging from 2 to 5 µm and layer 3 of N conductivity type may have a thickness ranging from 5 to 15 µm. Wafer 1 is preferably thinned down to have a thickness ranging from 100 to 200 µm. The first and second vias may have lateral dimensions ranging from 1 to 10 µm. Antenna 13 is preferably intended to transmit in the millimetric wave range and the metallization strips that form it for example have widths ranging from 5 to 10 µm.

Embodiments of the described device may include the following advantageous features:

it is particularly compact since the photovoltaic cell, the interconnection levels, and the antenna are formed on a single wafer;
manufacturing the device only requires technological steps tried and tested in semiconductor manufacturing;
the single-crystal silicon based photovoltaic cell provides a high efficiency;
the high conductivity of the single-crystal silicon of the photovoltaic cell makes it possible to widely space apart the vias collecting the charges originating from the photovoltaic cell;
the surface area of the inactive area of the photovoltaic cell, comprising no vias, is small; and
as illustrated in FIG. 2, no via is present in the half-space located above the antenna; thus, no conductive region capable of disturbing the radiation of antenna 13 is present.

Variations of the stand-alone wireless device may include:
multiplying the number and the type of sensors connected to the lower surface of the wafer,
connecting no battery if the measurements must only be performed under a minimum lighting condition enabling the photovoltaic cell to directly power the sensor and the radio frequency generator,
adding sound or visual signaling chips, to form an alarm repeater, for example, and
adding a radio frequency reception chip so that a distant system can control the device.

Of course, the present invention is likely to have various alterations regarding the thicknesses of the layers and/or of the substrate, the position of the antenna and the dimensions which will be selected by those skilled in the art according to the desired performances of the device.

Further, various known modifications and variations of the forming of a photovoltaic cell on a silicon wafer may be used. In particular, the layers forming the photovoltaic cell may be deposited on a non-planar support to increase the efficiency of the cell and its sensitivity to oblique lightings. For example, the surface area of the junction may be developed by using known selective growth or silicon etching techniques to create trenches in which the PN junction is formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
a silicon wafer having its front surface comprising a first layer of a first conductivity type and a second layer of a second conductivity type forming a photovoltaic cell;
first vias crossing the wafer from a rear surface of the first layer and second vias crossing the wafer from the rear surface of the second layer;
metallization levels on the rear surface of the wafer, an external level of these metallization levels defining contact pads;
an antenna formed in one of the metallization levels;
one or more chips assembled on the contact pads and attached to the rear surface of the wafer; and
an encapsulant embedding the one or more chips;
wherein the metallization levels are shaped to provide selected interconnects between different elements of the device;
wherein the device comprises a stand-alone device; and
wherein the photovoltaic cell is coupled to only chips within the encapsulant and is configured to supply power to only chips within the encapsulant.

2. The device of claim 1, wherein all areas located directly above the antenna and below the photovoltaic cell comprise no vias.

3. The device of claim 1, wherein the one or more chips comprises a plurality of chips, including a battery, a sensor, and a radio frequency generator.

4. The device of claim 1, wherein the encapsulant comprises a resin such that the rear surface of the wafer and the one or more chips are embedded in the resin.

5. The device of claim 1, wherein the front surface of the silicon wafer comprises a major surface of the device, greater than or equal to all other surfaces of the device, wherein the front surface has a surface area less than or equal to 4 cm$^2$.

6. A device comprising:
a photovoltaic cell including a first layer of a first conductivity type formed overlying a top surface of a substrate and a second layer of a second conductivity type overlying the first layer;
a first through substrate via (TSV) passing from the first layer through the substrate to a second surface of the substrate and not extending to the second layer; and a second TSV passing from the second layer through the first layer and the substrate to the second surface of the substrate;

a first metallization layer underlying the second surface of the substrate, the first metallization layer including a plurality of landings, a first landing being electrically coupled to the first layer by the first TSV and a second landing being electrically coupled to the second layer by the second TSV; and a second metallization layer underlying the second surface of the substrate, the first metallization layer being between the second surface of the substrate and the second metallization layer;

wherein the second metallization layer includes a plurality of contacts, a first contact being electrically coupled to the first landing through a first vertical conductor and a second contact being electrically coupled to the second landing through a second vertical conductor; and wherein the second metallization layer also includes an antenna formed directly below portions of the first and second layers, wherein all areas located directly above the antenna comprise no TSV.

7. The device of claim 6 further comprising:

a plurality of first TSVs passing from the first layer through the substrate to the second surface of the substrate and not extending to the second layer; and a plurality of second TSVs passing from the second layer through the first layer and the substrate to the second surface of the substrate.

8. The device of claim 7 wherein the plurality of first and second TSVs are arranged in an alternating linear pattern across the device.

9. The device of claim 6 wherein the first layer is N type semiconductor and the second layer is P type semiconductor.

10. The device of claim 6 further comprising a chip electrically coupled to the photovoltaic cell by way of at least one of the first TSV and the second TSV.

11. The device of claim 6 further comprising a chip electrically coupled to the first contact.

12. The device of claim 11 wherein the chip is electrically coupled to the first contact by way of a contact ball.

13. The device of claim 11 wherein the chip is embedded in a resin.

14. The device of claim 6 further comprising a plurality of chips electrically connected to the plurality of contacts.

15. The device of claim 14 wherein the plurality of chips include a battery, a sensor, and a radio frequency generator.

16. The device of claim 6 wherein the antenna comprises a first L-shaped conductor having two branches and a second L-shaped conductor having two branches, a first branch of the first L-shaped conductor being adjacent and parallel to a first branch of the second L-shaped conductor and a second branch of the first L-shaped conductor parallel to and extending in an opposite direction to a second branch of the second L-shaped conductor.

17. The device of claim 6 wherein the substrate is between 100 to 200 μm thick.

18. A device comprising:

a photovoltaic cell including a first layer of a first conductivity type overlying a top surface of a semiconductor substrate and a second layer of a second conductivity type overlying the first layer, wherein the semiconductor substrate has a thickness of at least five times a combined thickness of the first and second layers;

a first through substrate via (TSV) passing from the first layer through the semiconductor substrate to a second surface of the semiconductor substrate and not extending to the second layer, wherein the first TSV comprises an insulating core encased in a conductive wrapper, the conductive wrapper in contact with the first layer; and a second TSV passing from, but not through, the second layer through the first layer and the semiconductor substrate to the second surface of the semiconductor substrate, wherein the second TSV comprises an insulating core encased in a conductive wrapper, the conductive wrapper in contact with the second layer.

19. The device of claim 18, wherein a thickness of the first layer is between 5 and 15 micrometers and a thickness of the second layer is between 2 and 5 micrometers.

20. The device of claim 18, wherein the first TSV is flush with a surface of the first layer and the second TSV is flush with a surface of the second.

21. The device of claim 18, further comprising a plurality of metallization layers formed on the second surface of the substrate.

22. The device of claim 21, further comprising an antenna formed in one of the metallization layers.

23. The device of claim 22, further comprising a plurality of chips coupled to the second surface of the substrate through the metallization layers.

24. The device of claim 23, wherein the plurality of chips comprise a battery, a sensor, and a radio frequency (RF) generator.

25. A device comprising:

a substrate;

a first semiconductor layer of a first conductivity type overlying the substrate;

a second semiconductor layer of a second conductivity type overlying the first layer, the second conductivity type opposite the first conductivity type, wherein the first and second layers comprise a photovoltaic cell;

a plurality of first through-vias passing through the substrate from the first semiconductor layer to a bottom surface of the substrate;

a plurality of second through-vias passing through the substrate and the first semiconductor layer from the second semiconductor layer to the bottom surface of the substrate, wherein the first and second through-vias are arranged in an array of rows and columns over a portion of a top surface of the substrate, the array including alternating ones of the first and second through-vias along each row; and a metallization layer formed adjacent the bottom surface of the substrate, a first portion of the metallization layer electrically connected to the first and second through-vias and a second portion of the metallization layer forming an antenna, wherein the antenna is formed directly below portions of the first and second semiconductor layers, and no first or second through-vias are located directly above the antenna.

26. The device of claim 25, further comprising a battery underlying the substrate and electrically coupled to the first portion of the metallization layer, the battery configured to receive power from the photovoltaic cell.

27. The device of claim 26, wherein the battery comprises a first terminal and a second terminal and wherein every first through-via of the plurality of first through-vias is electrically connected to the first terminal and every second through-via of the plurality of second through vias is electrically connected to the second terminal.

28. The device of claim 25, further comprising a radio frequency (RF) generator underlying the substrate and electrically coupled to the antenna.

29. The device of claim 25, further comprising a sensor underlying the substrate and electrically coupled to the metallization layer.

30. The device of claim 25, wherein the substrate comprises a single silicon body having a top surface area less than or equal to 4 cm$^2$.

* * * * *